United States Patent
Xu et al.

(10) Patent No.: US 6,737,203 B2
(45) Date of Patent: May 18, 2004

(54) PHOTOSENSITIVE RESIN COMPOSITIONS FOR COLOR FILTER APPLICATIONS

(75) Inventors: Gu Xu, Rolla, MO (US); Dan W. Brewer, St. James, MO (US); Timothy Limmer, Rolla, MO (US); Mike Stroder, Springfield, MO (US); Shelly Fowler, Rolla, MO (US); Jonathon Mayo, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 10/084,287

(22) Filed: Feb. 25, 2002

(65) Prior Publication Data

US 2002/0128342 A1 Sep. 12, 2002

Related U.S. Application Data

(62) Division of application No. 09/640,227, filed on Aug. 16, 2000, now abandoned.

(51) Int. Cl.$^7$ .............................. G03F 7/00; G03F 9/00
(52) U.S. Cl. .................... 430/7; 430/270.1; 522/35; 522/904; 522/905; 522/152
(58) Field of Search ................. 430/7, 270.1, 320, 430/321; 522/35, 904, 905, 150, 153, 152, 151, 154, 79

(56) References Cited

U.S. PATENT DOCUMENTS

| | | |
|---|---|---|
| 3,591,661 A | 7/1971 | Rogers |
| 4,740,561 A | 4/1988 | Tsujimoto et al. |
| 5,362,603 A | 11/1994 | Katoh et al. |
| 5,389,699 A | 2/1995 | Rehmer et al. |
| 5,445,919 A | 8/1995 | Wakata et al. |
| 5,514,502 A | 5/1996 | Wakata et al. |
| 5,532,112 A | 7/1996 | Kohler et al. |
| 5,641,594 A | 6/1997 | Kudo et al. |
| 5,650,263 A | 7/1997 | Wakata et al. |
| 5,821,016 A | 10/1998 | Satoh et al. |
| 5,827,626 A | 10/1998 | Kobayashi et al. |
| 5,998,091 A | 12/1999 | Suzuki |
| 6,007,966 A | 12/1999 | Lin |
| 6,027,856 A | 2/2000 | Nozaki et al. |
| 6,051,367 A | 4/2000 | Kunita et al. |

FOREIGN PATENT DOCUMENTS

| | | |
|---|---|---|
| EP | 0747947 | 5/1996 |
| EP | 0780731 | 10/1996 |

*Primary Examiner*—Susan Berman
(74) *Attorney, Agent, or Firm*—Hovey Williams LLP

(57) ABSTRACT

New polymers, compositions comprising these polymers, and methods of using these compositions are provided. The polymers comprise styrene and maleic anhydride monomers with at least some of the maleic anhydride monomers having certain functional groups bonded thereto. Preferred functional groups include those derived from adhesion promoters (e.g., 2-aminophenol), photoinitiators (e.g., 4-aminoacetophenone), and solubilizers (e.g., 4-aminobenzoic acid). The polymers can be incorporated according to conventional processes into compositions which are then used to form a color filter to be used in a liquid crystal display. The final color filter has a high resolution, is highly resistant to solvents typically used in the color filter manufacturing process, is strongly adhered to the color filter substrate, has superior optical clarity, is highly soluble in a wide range of alkali developers, and has excellent heat and UV light stability.

18 Claims, No Drawings

PHOTOSENSITIVE RESIN COMPOSITIONS FOR COLOR FILTER APPLICATIONS

RELATED APPLICATIONS

This application is a divisional of U.S. patent application Ser. No. 09/640,227 filed Aug. 16, 2000, now abandoned incorporated by reference herein.

BACKGROUND OF THE INVENTION

1. Field of the Invention

The present invention is broadly concerned with new polymers, compositions comprising these polymers, and methods of using these compositions to form a color filter for use in a liquid crystal display. More particularly, the polymers comprise recurring monomers of styrene and maleic anhydride with amino functional groups (e.g., 4-aminoacetophenone, 2-aminophenol, 4-aminobenzoic acid) bonded to at least some of the maleic anhydride monomers.

2. Description of the Prior Art

Color filters are commonly used in liquid crystal display panels, imaging devices, and similar items, and are generally comprise a mosaic of pixels or as a striped pattern. A liquid crystal display is usually produced by forming a multicolor image layer on a transparent glass substrate. The multicolor image layer typically contains red, green, and blue picture elements and, in some cases, also includes a black-colored or black-shaded matrix. A protective layer is then formed on the multicolored image layer, and a transparent conductive layer is subsequently formed on the protective layer, usually by sputtering of indium-tin-oxide (ITO). In the case of a super twisted nematic (STN)-type or a ferroelectric liquid crystal-type panel, the transparent conductive layer is further processed through photolithography to yield a color filter equipped with a transparent electrode, after which an oriented film is formed on the transparent electrode. That substrate and another similarly-formed substrate are sealed together with a gap therebetween, with liquid crystals being poured between the two substrates to yield the display panel.

In the past, the protective layer has been formed on the multicolor image layer for a variety of reasons. For example, the protective layer protects the multicolor image layer from various chemicals (e.g., solvents for the photoresist, acidic etching solutions, basic resist release solutions, solvents for the oriented film coating) used in the photolithographic process carried out to produce the transparent conductive layer. Furthermore, the protective layer gives flatness to the multicolor image layer and assists in maintaining the gap between the two substrates into which the liquid crystals are poured. It is important that the protective layer is transparent (without cloudiness or turbidness) in the visible light region, and that the layer is strongly adhered to both the multicolor image layer and to the substrate.

Recently, there has been a demand to remove the protective layer in order to insure sealing in the non-image portions. As a result, the color layer must be formulated to function in the same manner as the protective layer. Photosensitive resin-type binders are generally used as binders for the color layer in order to enable the layer to meet the above-described requirements. The most popular of these binder resins are those which can be crosslinked by a photo-induced reaction when exposed to UV light. The unexposed portions can then be developed in aqueous alkali solutions which are safe and are the environmentally preferred solutions. The resin is thereafter further cured by heating to give increased chemical resistance.

Color filters containing such a photosensitive resin are prepared by dispersing pigments in the resin. The resin/pigment system also includes dispersing agents which stabilize the pigment dispersion, surfactants which improve the coating smoothness, an addition-polymerizable monomer having an ethylenically unsaturated double bond which improves photo-crosslinking density, and photoinitators for catalyzing the photo-crosslinking reaction.

The color filters must have several other properties in addition to the properties discussed above with respect to the protective layer. For example, the color filter must be able to define a clear pattern of pixels or stripes at small dimensions (e.g., pixel sizes as small as 5 $\mu$m). To produce a distinct image without blurriness or fuzziness, the pixels must also be of uniform size and thickness and have straight, clean edges without roughness or pigment residue. Furthermore, the pigments in the composition used in forming the color filter must remain dispersed in the composition over long periods of time, and the composition must also maintain color purity even after prolonged exposure to light. That is, there should be little or no yellowing or discoloration of either the photosensitive resin or the pigments of the composition. Finally, the resulting color filter must be readily processible by standard photolithographic techniques (e.g., the color filter should not require a broadband UV exposure of over 600 millijoules).

Examples of known photosensitive resins for color filters are described in U.S. Pat. No. 5,445,919 to Wakata et al., U.S. Pat. No. 5,514,502 to Wakata et al., and U.S. Pat. No. 5,650,263 to Wakata et al. These patents describe photopolymerizable compositions which comprise a photopolymerization initiator or a photopolymerization initiator system, an addition-polymerizable monomer having at least one ethylenically unsaturated double bond, and a resin obtained by reaction of an anhydride-containing copolymer having a number average molecular weight of 500 to 30,000. This resin has primary amines in a ratio to the copolymer at 0.1 to 1.0 equivalent per equivalent of the anhydride in the copolymer.

Another resin of this type is disclosed in U.S. Pat. No. 5,641,594 to Kudo et al. This composition includes: a polymer having alcoholic or phenolic hydroxyl groups; a compound capable of producing a nitrene when irradiated with an actinic radiation; a pigment; and a solvent. The composition can further contain a heat crosslinking agent and/or a compound having a polymerizable double bond in addition to the above ingredients.

The compositions described in the '919, '502, '263, and '594 are inadequate for developing color filters with sufficient resolution and small pixel size required in modern high-resolution devices. While these compositions may satisfy some of the requirements described above, none of these resins can meet all color filter needs, especially at 2–4 $\mu$m resolution. Furthermore, these compositions require the use of a thermal-crosslinking agent such as tris(acryloloxyethyl) isocyanurate, diisocyanates, or methacrylate melamine compounds. While such additives can improve film hardness and chemical resistance, they are difficult to use and environmentally unfriendly. Isocanates in particular are known carcinogens.

U.S. Pat. No. 5,998,091 to Suzuki describes the synthesis of various monomers, that may be useful for the synthesis of a photosensitive resin which can be used to manufacture color filter materials. While this patent discloses various monomer structures which aid in adhesion to the substrate, alkaline solubility, and pigment dispersion stability, it does not disclose a final polymer composition which can meet the needs described above. In particular, this patent does not disclose a composition which has high photosensitivity, film hardness, and chemical resistance required for color filter materials.

European Patent Application No. 780,731 describes a photosensitive resin which incorporates a phosphoric methacrylate resin, in addition to the photosensitive resin to improve solubility in alkali developer. However, this system discloses nonhomogenous intermixing of the two binder resins which can result in uneven develop characteristics across the entire color filter panel. This is especially true at 2–4 μm pixel sizes, where uniform development is very critical.

U.S. Pat. No. 6,007,966 to Lin describes an alkali-developable, negative acting photosensitive composition which comprises a polymer binder, a photoinitiator, and an unsaturated photomonomer. The polymer binder is prepared from a reaction among a styrene-maleic anhydride resin containing repeating units of styrene and anhydride groups, an unsaturated compound containing at least one hydroxy group and at least three acrylic groups, and a saturated alcohol. This resin system is not optimized for high resolution color filter applications, instead it is designed for the manufacture of printed circuit boards, which have large feature sizes. Thus, this system cannot be used to produce a color filter pattern with clear 2–4 μm resolution.

U.S. Pat. No. 6,051,367 to Kunita et al. a photopolymerizable composition which comprises a compound having one or more addition-polymerizable ethylenically unsaturated bonds and a specific oxime ether compound. However, this compound produces a film where unexposed areas are not developable in aqueous alkali solutions, but instead require a solvent developer. Furthermore, this composition is not suitable for achieving 2–4 μm high resolution patterns.

U.S. Pat. No. 6,027,856 to Nozaki et al. describes a negative-type resist composition which is developable in a basic aqueous solution and comprises a film-formable, basic aqueous solution-soluble polymer with an alkali-soluble group. The composition also includes a compound with an allyl alcohol structure and a photoacid generator which when decomposed by absorption of image-forming radiation causes the compound with an allyl alcohol structure to become a protecting group for the alkali-soluble group, as well as a resist pattern-forming process which employs it. A basic aqueous solution can be used as the developing solution, however, the photoacid generator used in this composition requires an extra hotplate bake process step over conventional color filter materials. Also, as this composition is a negative photoresist, it is not formulated to support pigment dispersions which are used in color filter materials.

SUMMARY OF THE INVENTION

The present invention overcomes the problems of the prior art by broadly providing new polymers, compositions comprising these polymers, and methods of using these compositions to form color filters for use in a liquid crystal display.

In more detail, the polymers according to the invention comprise various functional groups (e.g., adhesion promoting groups, photoinitiating groups, solubilizing groups) grafted onto or bonded to at least some of the maleic anhydride monomers of a precursor polymer comprising styrene and maleic anhydride monomers. The precursor polymers can include other monomers in addition to styrene and maleic anhydride, but it is preferred that a styrene-maleic anhydride (SMA) copolymer be utilized. Preferably, the molar ratio of styrene:maleic anhydride in the precursor polymer is from about 1:1 to about 4:1, preferably from about 2:1 to about 4:1, and more preferably about 3:1. The preferred functional groups comprise an aryl moiety with at least one amino group bonded thereto.

The inventive polymer is formed by reacting the selected functional group(s) (either one at a time or simultaneously) with the precursor polymer under conditions to cause at least some of the maleic anhydride rings (preferably at least about 60% of the rings) of the precursor polymer to break and nitrogen atoms from at least one of the respective amino groups to bond to the carbon atom of one of the carbonyl groups on the resulting maleic anhydride moiety. Thus, polymers formed according to the invention will comprise recurring monomers of the formulas

SCHEME A

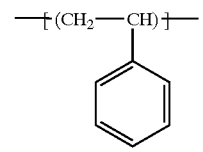

the styrene monomer
and

SCHEME B

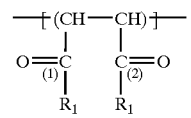

the maleic anhydride moiety with
functional group(s) bonded thereto wherein $R_1$ is a compound selected from the group consisting of —OH and compounds represented by the following formulas:

PHOTOINITIATORS

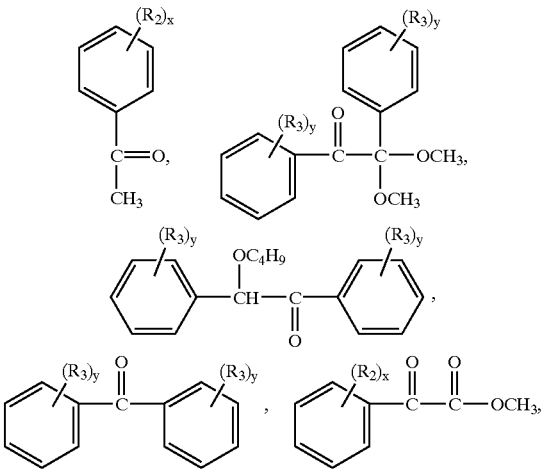

-continued

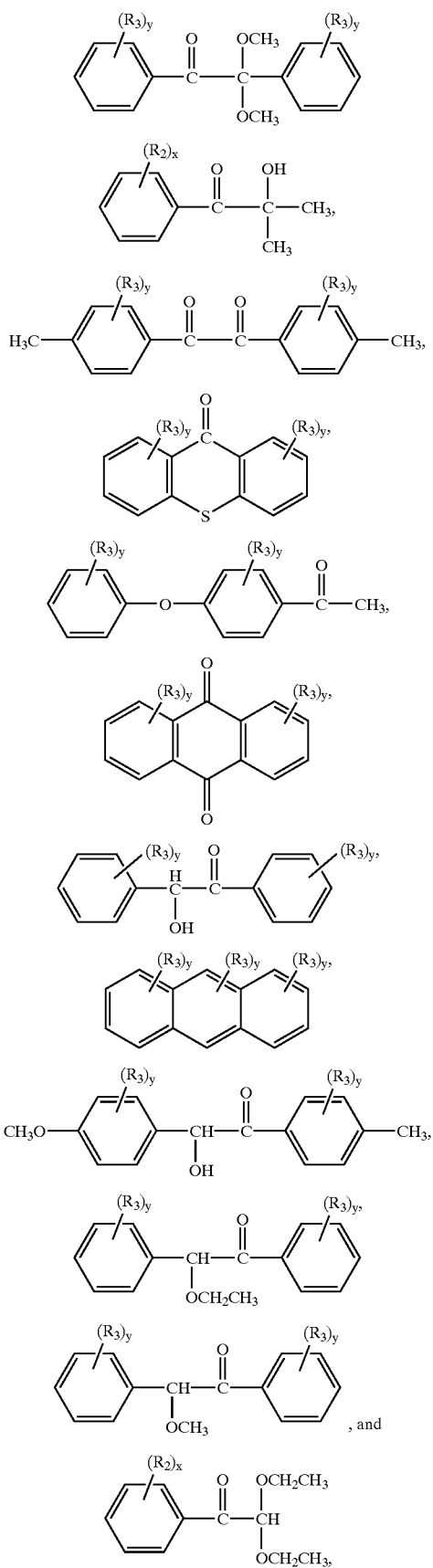

-continued

ADHESION PROMOTORS

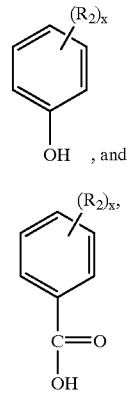

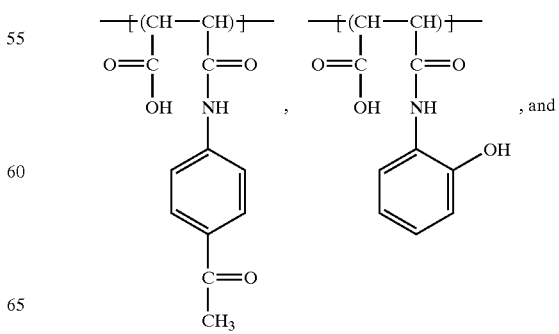

wherein in the above structural formulas:

each $R_2$ is individually selected from the group consisting of hydrogen, $-NH_2$, and $-NH$;

x is a number ranging from about 1–5, and preferably from about 1–2;

at least one $R_2$ is $-NH$ and the at least one $-NH$ is bonded to one of the carbon atoms labeled with a (1) or a (2);

each $R_3$ is individually selected from the group consisting of hydrogen, $-NH_2$, and $-NH$;

y is a number ranging from about 0–5, and preferably from about 1–2; and at least one $R_3$ is $-NH$ and the at least one $-NH$ is bonded to one of the carbon atoms labeled with a (1) or a (2), with at least one $R_1$ being one of the compounds represented by the above formulas (i.e., a compound other than an $-OH$ group).

In a particularly preferred embodiment, the polymer comprises recurring monomers of at least one of the structures of each class represented in the above formulas (i.e., at least one adhesion promoter, at least one photoinitiator, and at least one solubilizer). Even more preferably, the polymers include recurring monomers of each of the following formulas (i.e., the polymers include 4-aminoacetophenone, 2-aminophenol, and 4-aminobenzoic acid each individually reacted with at least one of the maleic anhydride monomers of the particular polymer).

-continued

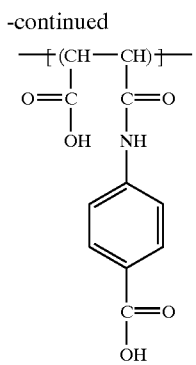

In an alternate embodiment, the polymer comprises a photoinitiator bonded thereto. The molar ratio of photoinitiator:maleic anhydride should be from about 1:20 to about 1:1.45, preferably from about 1:20 to about 1:2.5, and more preferably from about 1:10 to about 1:5. The photoinitiator is useful because it improves the degree of crosslinking of color filter compositions including the inventive polymers. Enhanced crosslinking improves pattern resolution, substrate adhesion, film hardness, and chemical resistance of films or layers formed from such filter compositions. A particularly preferred monomer comprising a maleic anhydride moiety reacted with a photoinitiator is represented by the formula

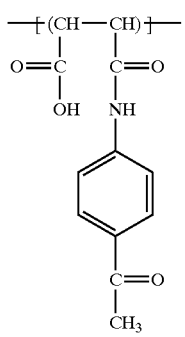

The polymer preferably further comprises an adhesion promoting group bonded thereto. This is beneficial for forming a pigmented color filter composition which will strongly adhere to the substrate of the liquid crystal display panel thus improving pattern resolution and edge sharpness. The adhesion promoting group should comprise from about 2–50% by weight, preferably from about 2–25% by weight, and more preferably from about 4–10% by weight of the polymer, with the percentage by weight being based upon the total weight of the polymer taken as 100% by weight and referring only to the weight attributable to the adhesion promoting portion of the polymer (i.e., not including the weight of the maleic anhydride moiety to which the adhesion promotor is bonded). The preferred monomer comprising a maleic anhydride moiety reacted with an adhesion promoter is represented by formula

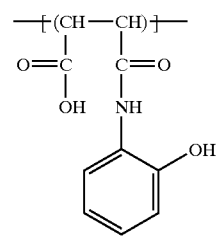

It is also preferred that the polymer comprise a functional group bonded thereto which acts to improve the solubility of compositions including the inventive polymer in aqueous alkali developers such as tetramethylammonium hydroxide, potassium hydroxide, and sodium carbonate developers. Improved solubility in the developer will lead to improved pattern resolution and edge sharpness of the color filter. This solubility-improving monomer preferably comprises from about 2–50% by weight, preferably from about 2–20% by weight, and more preferably from about 4–10% by weight, with the percentages by weight being based upon the total weight of the polymer taken as 100% by weight and referring only to the weight attributable to the solubilizing portion of the polymer (i.e., not including the weight of the maleic anhydride moiety to which the solubilizer is bonded). A particularly preferred monomer comprising a maleic anhydride moiety reacted with a solubilizing compound is represented by the formula

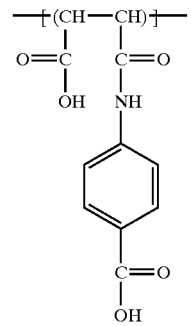

The polymers formed according to the invention have an average molecular weight of from about 7,000–13,000 Daltons, and preferably from about 9,000–11,000 Daltons. It will be appreciated that these polymers can be incorporated into compositions which are used to form the pixels on an image layer of a liquid crystal display. Such compositions can be formed according to known preparation procedures. For example, a pigment slurry can be prepared by mixing the desired types and concentrations of pigments with dispersants and/or solvents for the particular pigments. A colored pigment mother liquor can be prepared by mixing a binder resin solution comprising the inventive polymer with the pigment slurry. The resulting mixture is then ground, and a surfactant solution is mixed therewith. The pigment mother liquor is mixed with the desired curing agents, solvents, surfactants, and any other desired ingredients followed by filtering of the mixture to an average particle size of less than about 0.2 μm.

The resulting colored, photosensitive coating composition can then be applied to a substrate (e.g., glass, silicon, ITO glass, color filter layers, etc.) by conventional processes (such as by spin-coating at about 1000 rpm followed by baking on a hotplate at about 100° C.). The coated film is exposed through a mask to light at the desired wavelength (e.g., from about 200–500 nm) followed by developing of the film, preferably in a basic developer (e.g., MF312-D27, available from Shipley Company). Finally, the developed film is cured on a hotplate under vacuum at a temperature of from about 150–210° C., and the process is repeated as necessary with different pigment colors to obtain differently colored pixels as desired for the particular application (e.g., red, green, and blue pixels), and a protective layer can be applied to the final image layer and cured.

Advantageously, coating compositions utilizing the polymers of the invention give a solvent resistance test result (as defined in Example 7) of less than about 5, preferably less than about 3, and more preferably less than about 2 when PGMEA is used as the solvent. Thus, the resulting films are highly solvent resistant and do not require the use of additional thermal crosslinking agents such as diiosocyanates which are hazardous to the user as well as to the environment.

Also, a color filter formed according to the invention comprising an image layer having a thickness of about 1.5 $\mu$m will transmit from about 70–95%, preferably from about 80–95%, and more preferably from about 85–90% of light at a wavelength of from about 400–700 nm. Additionally, the inventive color filters will have a resolution of less than about 5 $\mu$m, preferably from about 2–4 $\mu$m, and more preferably from about 1–2 $\mu$m, as determined by a scanning electron microscope. A film formed from compositions comprising the inventive polymers and deposited and cured on a substrate will have a pencil hardness (as determined by JIS K5400) of at least about 4H, and preferably at least about 8H.

Furthermore, films formed from the inventive compositions are highly soluble in alkali developers and exhibit essentially no discoloration or yellowing when exposed to UV light for up to about 2 million lux-hours or when exposed to curing temperatures for time periods of up to about 7 hours. Finally, films formed with the inventive compositions adhere strongly to substrate surfaces and exhibit excellent flatness even over topographical surfaces.

DETAILED DESCRIPTION OF THE PREFERRED EMBODIMENTS

EXAMPLES

The following examples set forth preferred methods in accordance with the invention. It is to be understood, however, that these examples are provided by way of illustration and nothing therein should be taken as a limitation upon the overall scope of the invention.

Example 1

Binder Resin Synthesis

In this example, 300 g of poly(styrene-co-maleic anhydride) (SMA) were dissolved in 1,000 g of propylene glycol methyl ether acetate (PGMEA) to form an SMA polymer solution. The molar ratio of styrene to maleic anhydride was 3:1, and the molecular weight of the polymer was about 11,000 Daltons.

Next, 45.62 g (337.5 mmoles) of 4-aminoacetophenone were transferred from a flask to a 3,000 mL glass flask containing 1,200 g of the SMA polymer solution. PGMEA (32 g) was used to rinse residual 4-aminoacetophenone from the flask in which it was stored. The reaction of grafting the amino group of the 4-aminoacetophenone to the anhydride group of the polymer was carried out for 24 hours at ambient conditions while stirring and under nitrogen. PGMEA (32 g) and 14.73 g (135.0 mmoles) of 2-aminophenol were added to the reaction mixture, and the reaction was continued for 8 more hours. Next, 10.54 g (76.0 mmoles) of 4-aminobenzoic acid and 32 g of PGMEA were added to the mixture, and the reaction was continued for another 48 hours.

Example 2

Binder Resin Synthesis

In this example, 1,200 g of the SMA polymer solution prepared in Example 1 were mixed with the following compounds in a 3,000 mL glass flask: 45.62 g (337.5 mmoles) of 4-aminoacetophenone; 14.73 g (135.0 mmoles) of 2-aminophenol; and 10.54 g (76.9 mmoles) of 4-aminobenzoic acid. The flask was then rinsed with 96 g of PGMEA, and nitrogen was introduced into the flask. The reaction was carried out for 72 hours at ambient conditions while stirring. Subsequent analysis by infrared spectroscopy showed that the simultaneous reaction of SMA with the 3 amino compounds as described here gave the same binder resin composition as was obtained in Example 1 where the amino compounds were reacted sequentially with the SMA polymer.

Example 3

Binder Resin Synthesis

In this example, 300 g of SMA were dissolved in 1,000 g of cyclohexanone to form an SMA polymer solution. The molar ratio of styrene to maleic anhydride was 3:1, and the molecular weight of the polymer was about 11,000 Daltons.

Next, 1,200 g of the SMA polymer solution were mixed with the following compounds in a 3,000 mL glass flask: 27.4 g (202.7 mmoles) of 4-aminoacetophenone; 14.76 g (135.3 mmoles) of 2-aminophenol; and 27.8 g (202.8 mmoles) of 4-aminobenzoic acid. A total of 96 g of cyclohexanone was used to rinse the residual amino compounds from their respective flasks, and nitrogen was introduced into the 3,000 mL flask. The reaction of grafting the amino groups to the respective anhydride groups of the polymer was carried out for 72 hours under ambient conditions while stirring.

Example 4

Color Filter Coating Formulation, Deposition, and Patterning

Solsperse 22000 dispersant (3.06 g, available from Zeneca) and Solsperse 5000 dispersant (1.52 g, also available from Zeneca) were dissolved in 104 g of methyl ethyl ketone (MEK). To the resulting of the dispersion, 40.78 g of BASF L9361 green pigment and 10.21 g of yellow high resolution (HR) pigment (available from Dominion Color Corporation) were added while stirring to form a first solution. A second solution containing 74.37 g Solsperse 24000 (available from Zeneca) in cyclohexanone and PGMEA (solvent weight ratio of 1:1 and a solids content of 18% by weight) was mixed with the first solution. The resulting pigment mixture was ground into a slurry for 1 hour in a mill containing glass beads. The pigment slurry was stored for at least 12 hours in ambient conditions prior to use.

A mother liquor was formed by mixing 65 g of the binder resin solution prepared in Example 3 with 100 g of the green pigment slurry. The resulting mixture was ground for 1 hour in a mill, and a surfactant solution containing 0.2 g FC171 fluorosurfactant (available from 3M) in 55 g of MEK was added to the mill. The green pigment mother liquor was then ground for another ½ hour.

Next, 100 g of the green pigment mother liquor were mixed with the following compounds for 1 hour under ambient conditions: 0.05 g of FC430 fluorosurfactant (available from 3M); 5 g of dipentaerythritol pentacrylate esters (DPEPA, obtained from Sartomer under the name SR399); 1 g of octyl para-(dimethylamino)benzoate (ODAB); 25 g of MEK; 3 g of Irgacure 784 (available from Ciba); and 1 g of Irgacure 369 (also available from Ciba). The final photosensitive green coating was filtered through a filter having a pore size of 0.21 $\mu$m.

The filtered photosensitive green coating was then spin-coated at 850 rpm for 60 seconds onto a 4-inch silicon wafer to form a film which was then soft-baked on a hotplate (i.e., contacting the hotplate, but with no vacuum being applied) at 100° C. for 60 seconds. Using an I-line stepper, the film was exposed to 600 mJ/cm$^2$ of energy. The exposed green resin film was developed by dipping in a basic developer (MF312-D227, available from Shipley) for 25 seconds followed by immersing in deionized water for 20–25 seconds, rinsing with deionized water for 20–25 seconds, and finally curing for 10 minutes on a hotplate under vacuum at 250° C. The maximum transmittance of the green color filter (determined prior to developing of the film) at a light wavelength of about 560 nm was about 85% at a film thickness of 1.5 $\mu$m.

Properties of the green photosensitive coating were determined by using an optical microscope (500×) to view a field halfway between the center and the edge of the wafer. From these properties, the resolution (i.e., the smallest pixels achieved on the glass round) was determined to be about 2 $\mu$m. These data are recorded in Table 1.

TABLE 1

| PROPERTY | MINIMUM | MAXIMUM |
| --- | --- | --- |
| L/S Pair[a] | 1 $\mu$m | 2 $\mu$m |
| Pixel Array[b] | 1 $\mu$m | 3 $\mu$m |
| Hole Array[c] | 1 $\mu$m | 3 $\mu$m |
| Scum[d] | none | none |
| Isolated Residue | none | none |
| Thickness[e] | 1.45 $\mu$m[f] | 1.55 $\mu$m[f] |

[a]Line-space pair.
[b]Complete and intact 8 × 8 array of pixels.
[c]Complete 8 × 8 array of holes free of film all the way to the substrate.
[d]Defined as a continuous residue that bridges the gap between pixels.
[e]Measured using a Alphastep 200 profilometer.
[f]Average thickness of measurements at the following locations on wafer: at about the center of the wafer; about 1/3 of the way from the center to the wafer edge; and about 2/3 of the way from the center to the wafer edge Example 5

Comparative Example

This test was conducted to compare a green color filter coating using unmodified SMA as the binder and dissolved amino compounds as the coating additives (i.e., no pre-reaction of the SMA and the amino compounds) to the green color filter coating prepared in Example 3.

The SMA polymer solution (65 g) prepared in Example 1 was mixed with 100 g of the green pigment slurry prepared in Example 4 to form a mother liquor. The solution was ground for 1 hour in a mill, and a surfactant solution containing 0.2 g FC171 in 55 g MEK was added to the mill. The green pigment mother liquor was ground for another ½ hour.

Next, 100 g of the green pigment mother liquor were mixed with the following compounds for 1 hour under ambient conditions: 0.05 g of FC430 fluorosurfactant; 5 g of DPEPA; 1 g of Irgacure 369; 0.9862 g of 4-aminoacetophenone; 0.3206 g of 2-aminophenol; and 0.2273 g of 4-aminobenzoic acid. The final green photosensitive material was filtered through a filter having a pore size of 0.2 $\mu$m.

The filtered photosensitive green coating was spin-coated onto a 3-inch glass round to form a film which was soft-baked on a hotplate at 100° C. After exposure through a quartz mask on an I-line stepper for about 2 minutes, the exposed green resin film was dipped into a developer (MF312-D27) for 20–40 seconds. The green resin film showed no dissolution selectivity between the exposed and unexposed areas and did not develop. This demonstrated that grafting of 4-aminoacetophenone, 2-aminophenol, and 4-aminobenzoic acid to SMA was necessary to form a patternable color filter coating.

Example 6

Comparative Example

This test was conducted to compare a green color filter coating using SMA modified with 2-aminophenol and 4-aminobenzoic acid as the binder and dissolved 4-aminoacetophenone as the coating additive to the green color filter coating prepared in Example 3.

The SMA polymer solution (120 g) prepared in Example 1 was mixed with the following compounds in a 250 mL glass flask: 1.47 g (13.53 mmoles) of 2-aminophenol; and 1.05 g (20.28 mmoles) of 4-aminobenzoic acid. The flask was then rinsed with 9.6 g of PGMEA, and nitrogen was introduced into the flask. The reaction of grafting the amino groups to the respective anhydride groups of the polymer was carried out for 72 hours under ambient conditions while stirring to form a polymer binder solution.

A mother liquor was formed by mixing 65 g of the polymer binder solution with 100 g of the green pigment slurry prepared in Example 4. The solution was ground for 1 hour in a mill, and a surfactant solution containing 0.2 g FC171 in 55 g MEK was added to the mill. The green pigment mother liquor was ground for another ½ hour.

Next, 100 g of the green pigment mother liquor were mixed with the following compounds under ambient conditions: 0.05 g of FC430 fluorosurfactant; 5 g of DPEPA; 1 g of ODAB; 25 g of MEK; 3 g of Irgacure 784; 1 g of Irgacure 369; and 0.9862 g of 4-aminoacetophenone. The final photosensitive green coating was filtered through a filter having a pore size of 0.2 $\mu$m.

The filter photosensitive coating was spin-coated on a 3-inch glass round to form a film which was soft-baked on a hotplate at 100° C. After exposing the coated film through a quartz mask using an I-line stepper at 300–1000 mj/cm$^2$, the exposed green resin film was dipped in a developer (MF312-D27) for 20–40 seconds. The green resin film showed very poor dissolution selectivity between the exposed and unexposed areas. The poor development characteristics demonstrated that grafting 4-aminoacetophenone to SMA prior to formulation and coating was necessary to produce a patternable color filter coating.

Example 7

Preparation of Red Color Filter

A red color filter coating was formulated by mixing 141.9 g of PGMEA, 91.9 g of Disperbyk 182 (available from BYK), 5.1 g of dipentaerythritol pentacrylate ester (DPEPA), 33.7 g of the binder resin solution prepared in Example 2, 33.3 g of a red pigment (3B-RF, available from CIBA), and 16.1 g of a yellow HR pigment (available from Dominion Color Corporation). This solution was stirred for 10 minutes and added to a grinding mill which was then rinsed will 40 g of PGMEA. Grinding was carried out for one hour.

A second solution was prepared by mixing 9.5 g of PGMEA, 15.3 g of DPEPA, and 101.1 g of the binder resin solution prepared in Example 3. This solution was added to the mill containing the red pigment solution prepared above. Next, 30 g of PGMEA was used to rinse the mill. A mother liquor was formed after grinding for one hour. The red pigment mother liquor (55 g) was mixed with the following compounds for one hour under ambient conditions: 0.21 g of ODAB; 17.9 g of PGMEA; 1.49 g of Irgacure 784; and 0.51 g of Irgacure 369. The final photosensitive red coating was filter through a filter having a pore size of 0.20 μm.

Example 8

Solvent Resistance Test

The solvent resistance test is performed by spin-coating a filter coating onto a glass round at 1000 rpm for 90 seconds. The coated glass round is then baked on a hotplate for 60 seconds followed by exposure at about 500 millijoules. After exposure, the coated round is cured in an oven at 190° C. for one hour. The color (i.e., absorbance) of the cured coating is measured with a spectrophotometer across the visible spectrum (400–700 nm). The round is then placed in a solvent for 5 minutes after which it is rinsed with water and dried with high-pressure air. The color is measured again with a spectrophotometer across the visible spectrum. The difference in color is calculated as a ΔE*ab value as described by Gunter Wyszecki and W. S. Stiles in *Color Science Concepts and Methods, Quantitative Data and Formulae.* Wiley & Sons, 2d ed., pp. 166–168 (1982).

The solvent resistance test was carried out on the inventive green color filter coating formulated in Example 4 and the red color filter coating prepared in Example 7. The results from these tests are set forth in Table 2.

TABLE 2

|  | PGMEA | NMP[a] | Acetone | Developer[b] |
|---|---|---|---|---|
| green | 0.55 | 2.71 | 1.74 | 1.04 |
| red | 1.68 | 0.40 | 1.41 | 0.57 |

[a]N-methyl-2-pyrrolidone.
[b]A commercial tetramethyl ammonium hydroxide-based photoresist developer.

We claim:

1. The combination of:
 a substrate; and
 an image layer comprising a matrix of pixels, said image layer being deposited on said substrate and said pixels being formed from a composition comprising a polymer which comprises recurring monomers of the formulas Scheme A

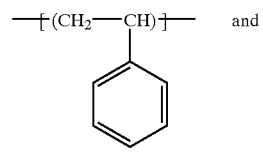

and

Scheme B

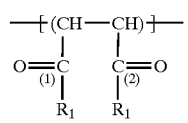

wherein $R_1$ is selected from the group consisting of —OH groups and those represented by the following formulas:

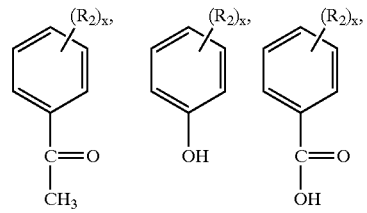

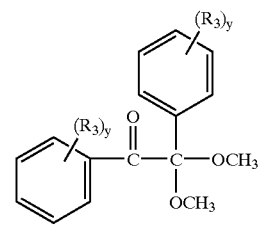

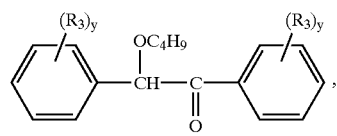

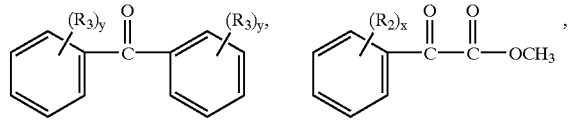

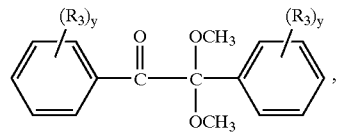

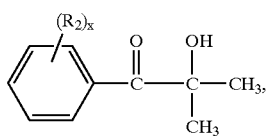

-continued

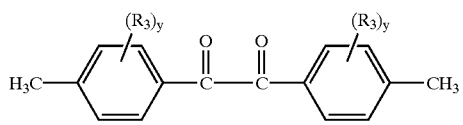

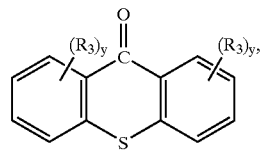

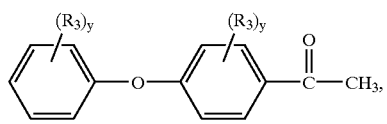

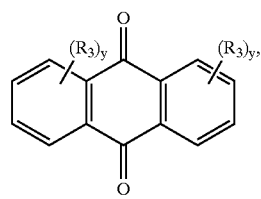

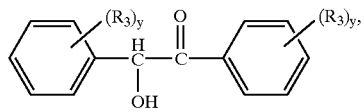

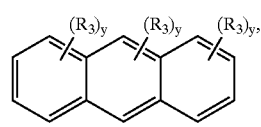

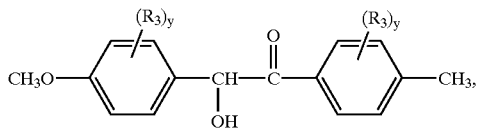

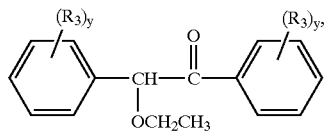

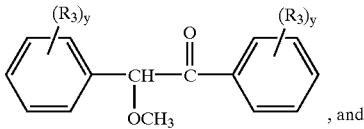

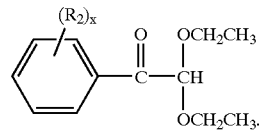

where:
each $R_2$ is individually selected from the group consisting of hydrogen, —$NH_2$, and —NH;
x is a number ranging from 1–5;
at least one $R_2$ is —NH and said at least one —NH is bonded to one of the carbon atoms labeled with a (1) or a (2);
each $R_3$ is individually selected from the group consisting of hydrogen, —$NH_2$, and —NH; and
y is a number ranging from 0–5, with there being at least one $R_3$ which is —NH and said at least one —NH is bonded to one of the carbon atoms labeled with a (1) or a (2), at least one $R_1$ being represented by the above formulas; and said image layer transimitting from about 70–95% of light at a wavelength of from about 400–700 nm when having a thickness of about 1.5 μm.

2. The combination of claim 1, wherein said polymer comprises recurring monomers of the formulas

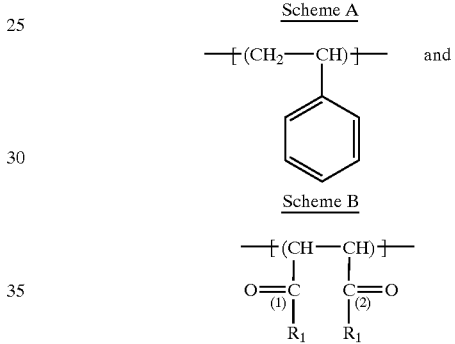

wherein $R_1$ is selected from the group consisting of —OH groups and those represented by the following formulas:

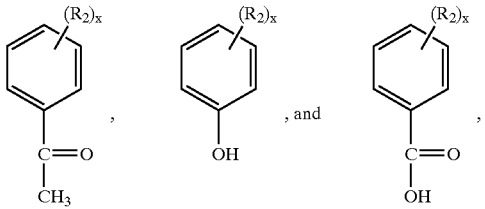

where:
each $R_2$ is individually selected from the group consisting of hydrogen, —$NH_2$, and —NH;
x is a number ranging from 1–5; and
at least one $R_2$ is —NH and said at least one —NH is bonded to one of the carbon atoms labeled with a (1) or a (2), and there being at least one of each of said $R_1$ present in said polymer.

3. The combination of claim 1, wherein said polymer comprises recurring monomers of the formulas

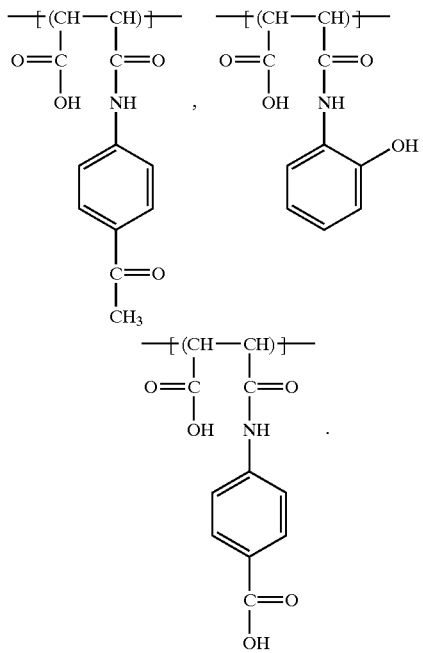
, and

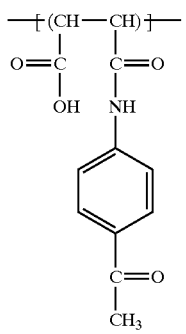

4. The combination of claim 1, wherein the molecular weight of said polymer is from about 7,000–13,000 Daltons.

5. The combination of claim 1, wherein said polymer comprises from about 5–70% by weight of a photoinitiating group bonded to the Scheme B monomers, said percentage by weight being based upon the total weight of polymer taken as 100% by weight and being only the weight attributable to the photoinitiating group.

6. The combination of claim 5, wherein said photoinitiating group bonded to a Scheme B monomer is represented by the formula

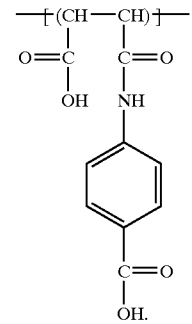

7. The combination of claim 1, wherein said polymer comprises from about 2–50% by weight of a group bonded to the Scheme B monomers for improving the adhesion to a substrate of compositions containing said polymer, said percentage by weight being based upon the total weight of the polymer taken as 100% by weight and being only the weight attributable to said adhesion-improving group.

8. The combination of claim 7, wherein said adhesion-improving group bonded to a Scheme B monomer is represented by the formula

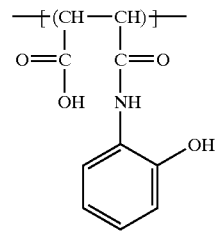

9. The combination of claim 1, wherein said polymer comprises from about 2–50% by weight of a group bonded to the Scheme B monomers for improving the solubility in alkali developing solutions of compositions containing said polymer, said percentage by weight being based upon the total weight of the polymer taken as 100% by weight and being only the weight attributable to the solubility-improving group.

10. The combination of claim 9, wherein said solubility-improving group bonded to a Scheme B monomer is represented by the formula

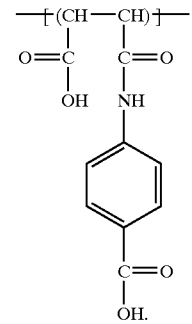

11. The combination of claim 1, wherein said substrate is formed of glass.

12. The combination of claim 1, wherein said image layer comprises a matrix of a plurality of differently colored pixels.

13. The combination of claim 12, wherein said image layer comprises a matrix of at least red, green, blue pixels.

14. The combination of claim 1, said filter further comprising a cured protective layer deposited on said image layer.

15. The combination of claim 1, wherein said image layer has a resolution of less than about 5 µm.

16. The combination of claim 1, wherein said composition gives a solvent resistance test result of less than about 5 when propylene glycol methyl ether acetate is used as the solvent.

17. The combination of claim 1, wherein said composition when formed into a cured film has a pencil hardness of at least about 2B.

18. The combination of claim 1, wherein when said image layer has a thickness of about 1.5 µm, said image layer transmits from about 70–95% of light at a wavelength of from about 400–700 nm.

* * * * *